United States Patent [19]
Oba

[11] Patent Number: 5,625,598
[45] Date of Patent: Apr. 29, 1997

[54] SEMICONDUCTOR MEMORY DEVICE HAVING PRECHARGE CIRCUIT

[75] Inventor: Kaori Oba, Tokyo, Japan

[73] Assignee: NEC Corporation, Tokyo, Japan

[21] Appl. No.: 575,474

[22] Filed: Dec. 20, 1995

[30] Foreign Application Priority Data

Dec. 21, 1994 [JP] Japan .................................. 6-318807

[51] Int. Cl.$^6$ .................................................. G11C 7/00
[52] U.S. Cl. ................................. 365/203; 365/230.06
[58] Field of Search .............................. 365/203, 230.06, 365/230.01, 189.11

[56] References Cited

U.S. PATENT DOCUMENTS 5,113,374  5/1992  Matsui ................................. 365/227
5,400,283  3/1995  Raad ................................... 365/203

FOREIGN PATENT DOCUMENTS 59-178684  10/1984  Japan .

*Primary Examiner*—David C. Nelms
*Assistant Examiner*—F. Niransan
*Attorney, Agent, or Firm*—Young & Thompson

[57] ABSTRACT

A semiconductor device has a precharge control circuit for generating a precharge control signal, the precharge control signal being at an active level when all word lines do not indicate a high level and being at an inactive level when an access control signal (read control signal or write control signal) is input to the precharge control circuit for controlling a precharge circuit for precharging bit lines to a predetermined voltage.

13 Claims, 5 Drawing Sheets

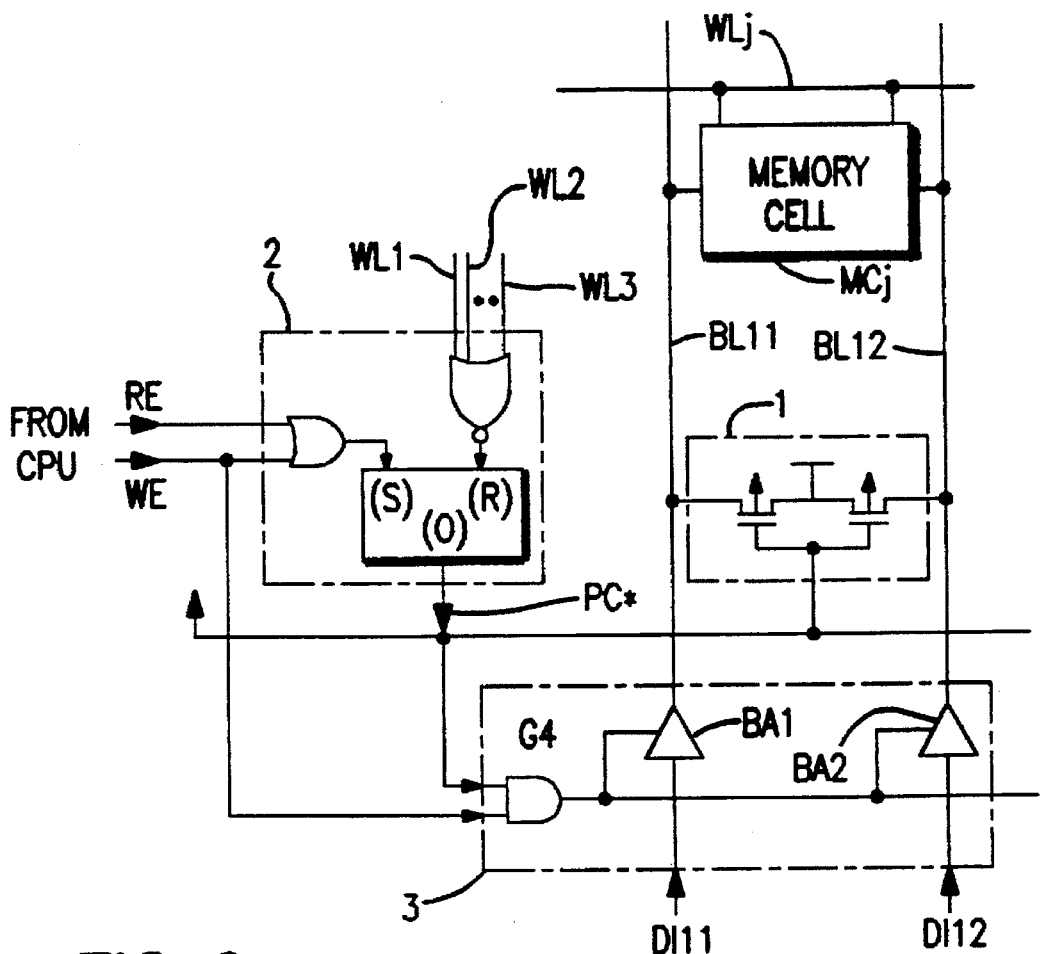
FIG. 3
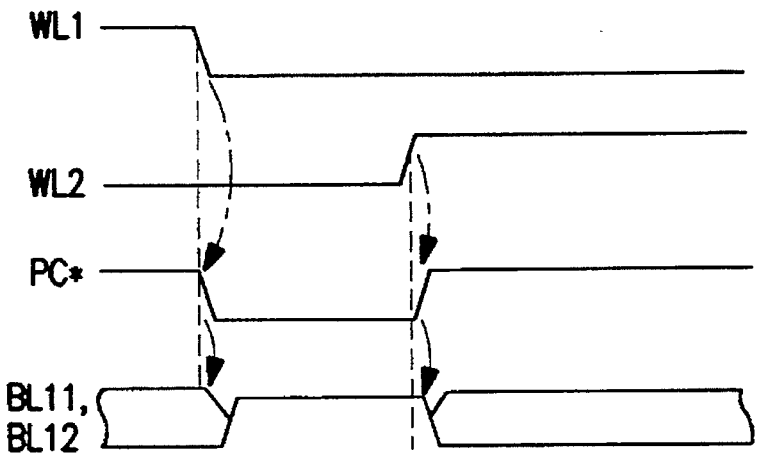
FIG. 7A PRIOR ART
FIG. 7B PRIOR ART
FIG. 7C PRIOR ART
FIG. 7D PRIOR ART

FIG. 5A PRIOR ART
FIG. 5B PRIOR ART
FIG. 5C PRIOR ART
FIG. 5D PRIOR ART
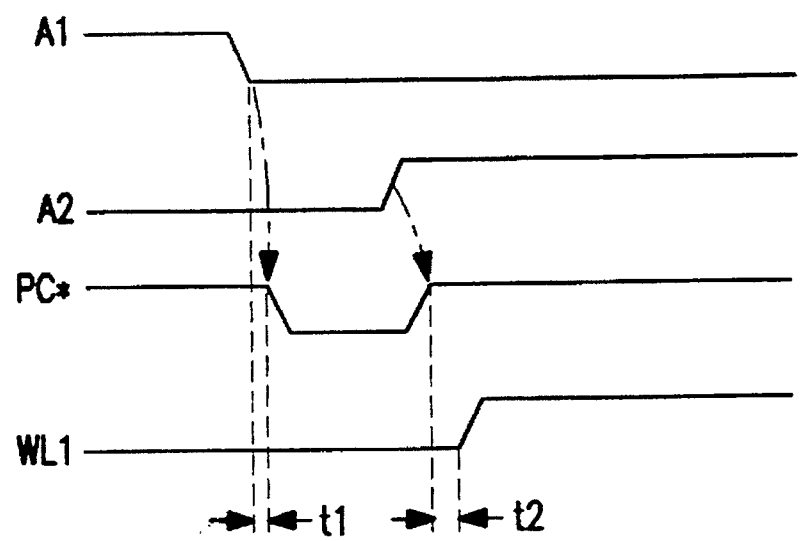
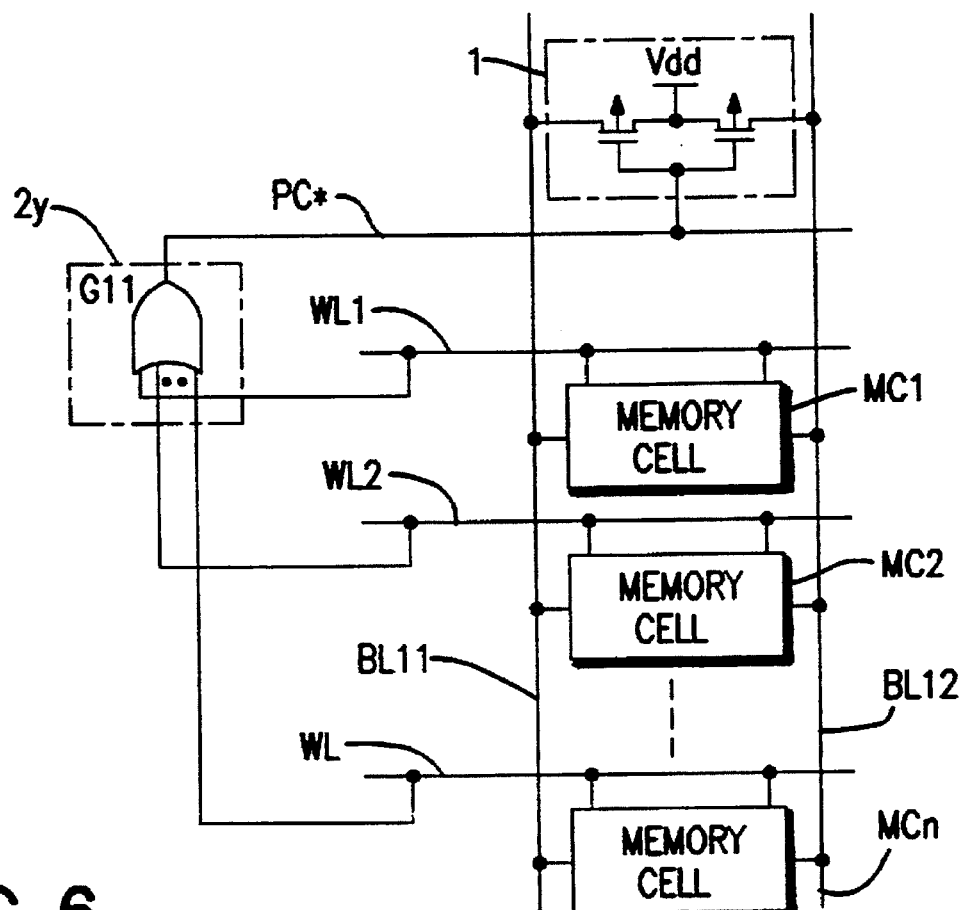
FIG. 6 PRIOR ART

SEMICONDUCTOR MEMORY DEVICE HAVING PRECHARGE CIRCUIT

BACKGROUND OF THE INVENTION

1. Field of the invention

The present invention relates to a semiconductor memory device, and more particularly to a semiconductor memory device having a precharge circuit.

2. Description of the Related Art

Recently, an improvement of memory device access speed is needed to increase microprocessor performance. However, as the memory capacity is increased, the number of memory cells connected to the pair of bit lines and the word lines is also increased, and the high speed operation becomes hard to be realized. For this reason, a memory device having an improved access time after precharging a pair of bit lines to a same potential is proposed.

Such as technique is disclosed in Japanese Patent Application Laid Open sho 59-178684. FIGS. 4(A) and 4(B) are a block diagram and a partial circuit diagram showing one column (first column of semiconductor memory cell array) of a semiconductor memory device having an address transition detector (ATD) system.

This semiconductor memory device comprises a plurality of memory cells MC1-MCn arranged in matrix form in row direction and column direction (only one column being indicated in FIG. 4(A)), a plurality of word lines WL1-WLn which bring the plurality of memory cells in a column to a selective state when they are at selection level, a plurality of mutually paired (only one pair being indicated in FIG. 4(A)) first bit line BL11 and second bit line BL12 provided corresponding to respective columns of the plurality of memory cells for transmitting write data and read data for memory cells in the selective state of the corresponding columns, load circuits 4 serving as loads to the memory cells in the selective state for supplying read data corresponding to stored data to the first and second bit line pairs and for transmitting and storing data transmitting from the bit line pairs to the memory cells, precharging circuits 1 which precharge the first and second bit line pairs to a power supply potential vdd in accordance with a precharging signal PC* (* indicates that the low level is the active level hereinafter), and a precharging signal generating circuit 21 which generates the precharging signal PC* by detecting changes in the address value of an address signal AD (with component bits A1-Am).

An address change detection circuit 21 as shown in FIG. 4(B) is provided for each of the component bit A1-Am of the address signal AD, in the precharging signal generating circuit 21 of this semiconductor memory device, and the precharging signal PC* is generated by integrating the outputs PC*i ('i' indicates a value from 1 to m) of these address change detection circuits 21.

In a semiconductor memory device, normally, precharging is started after all the word lines are brought to the non-selection level, and specified word lines are brought to the selection level, and specified word lines are brought to the selection level after complete release of the precharging, in order not to destroy data in the memory cell. Accordingly, in a semiconductor memory device which executes the precharging utilizing a precharging signal from the outside, the precharging signal is given a certain degree of margin of time from the setting of all the word lines to the non-selection level to the beginning of the precharging, and in the time from the release of the precharging to the selection of the word lines, by taking the operating times of the internal circuits into account.

For this reason, this prior art has a constitution in which the precharging is started by bringing the precharging signal PC* to the activation level after detecting changes of the component bits of the address signal AD to the low level, as shown in FIG. 5, so that the margin of time from the bringing of all the word lines to the non-selection level to the start of the precharging can be reduced, and the operating speed can be increased accordingly.

However, even in this semiconductor memory device, it is necessary, due to above-mentioned constitution of the device, to generate the precharging signal PC* so as to impart a certain degree of margin to all the memory cells as to the timing of the level change in the precharging signal PC* and the timings of the level change in the word lines t1 and t2. This fact imposes a difficulty on the further increase of the operating speed.

An example of a device which has a simple circuitry and yet enables to obtain an operating speed higher than that of the semiconductor memory device of ATD system, in which the precharging signal is generated after direct detection of level changes in the word lines, has been also proposed in this prior art.

Referring to FIG. 6, this semiconductor memory device receives the signal levels of a plurality of word lines WL1-WLn directly to a logic gate G11 of OR type and adopts its output as the precharging signal PC*. As shown in FIG. 7, high speed operation becomes possible, and yet circuity can be simplified drastically. However, there is absolutely no margin between the level change in the precharging signal PC* and the level change in the word lines.

In the above mentioned prior art semiconductor memory devices, the first example has a constitution in which the precharging signal PC* is generated by detecting the level change in the component bits A1-Am of the address signal AD. Therefore, the margin between the timing of the level change in the precharging signal PC* and the timing of the level change in the word line can be reduced compared with the case of a semiconductor memory device which is operated by receiving the precharging signal from the outside, and hence the operating speed can be increased accordingly. In spite of this, it is still necessary to give a certain degree of margin as to the two timings because the level changes in the word lines are not directly detected, and there remains a problem in that a further increase in the operating speed is difficult to realize.

On the other hand, the second example has a constitution in which the precharging signal PC* is generated by directly detecting the level change in the word lines so that there is absolutely no margin as to the two timings, enabling a further increase in the operating speed and a simplification of the circuit configuration. In spite of this, since, at the time of transition to the release of the precharging, the precharging signal PC* is brought to the deactivation level after detection of changes in the selection level of the word lines, the timing of connection of the memory cells to the bit lines owing to the selection level of the word lines overlaps with the timing of transition to the release of the precharging, which generates a possibility of destroying the stored contents of the memory cells.

SUMMARY OF THE INVENTION

An object of the present invention is, therefore, to provide a memory device which is able to reduce an access time and a precharging time and to prevent stored data from destruction during a precharging phase.

To achieve the above object, the present invention comprises a plurality of word lines, a plurality of memory cells connected to corresponding word lines, and each of memory cells connected to a bit line, a precharge circuit for precharging the bit line to a predetermined voltage corresponding to an active level of a precharge control signal, and a procharge control circuit for generating the precharge control signal, the precharge control signal being at the active level when all of word lines indicate a non-selective level and being at an inactive level when an access control signal is input to the precharge control circuit.

Therefore, destruction of the stored data of the memory cells can be prevented by the precharging operation of bit lines. Moreover, since it is possible to reduce the precharging start period and the transition period to the precharging release which are the links between the access period at the memory cell selection and the bit line precharging period within one access cycle, to the absolute minimum time so that this invention has the effect of realizing an improvement of the operating speed.

BRIEF DESCRIPTION OF THE DRAWINGS

The above and other objects, advantages and features of the present invention will be more apparent from the following description taken in conjunction with the accompanying drawings, in which

FIG. 3 shows a circuit diagram of a second embodiment of the present invention;

FIG. 5 shows a timing chart of the first example of the prior art;

FIG. 6 shows a circuit diagram of a second example of the prior art; and

FIG. 7 shows a timing chart of the second example of the prior art.

DETAILED DESCRIPTION OF THE PREFERRED EMBODIMENTS

The present invention will be described with reference to the accompanying drawings hereinafter.

Figure 1:
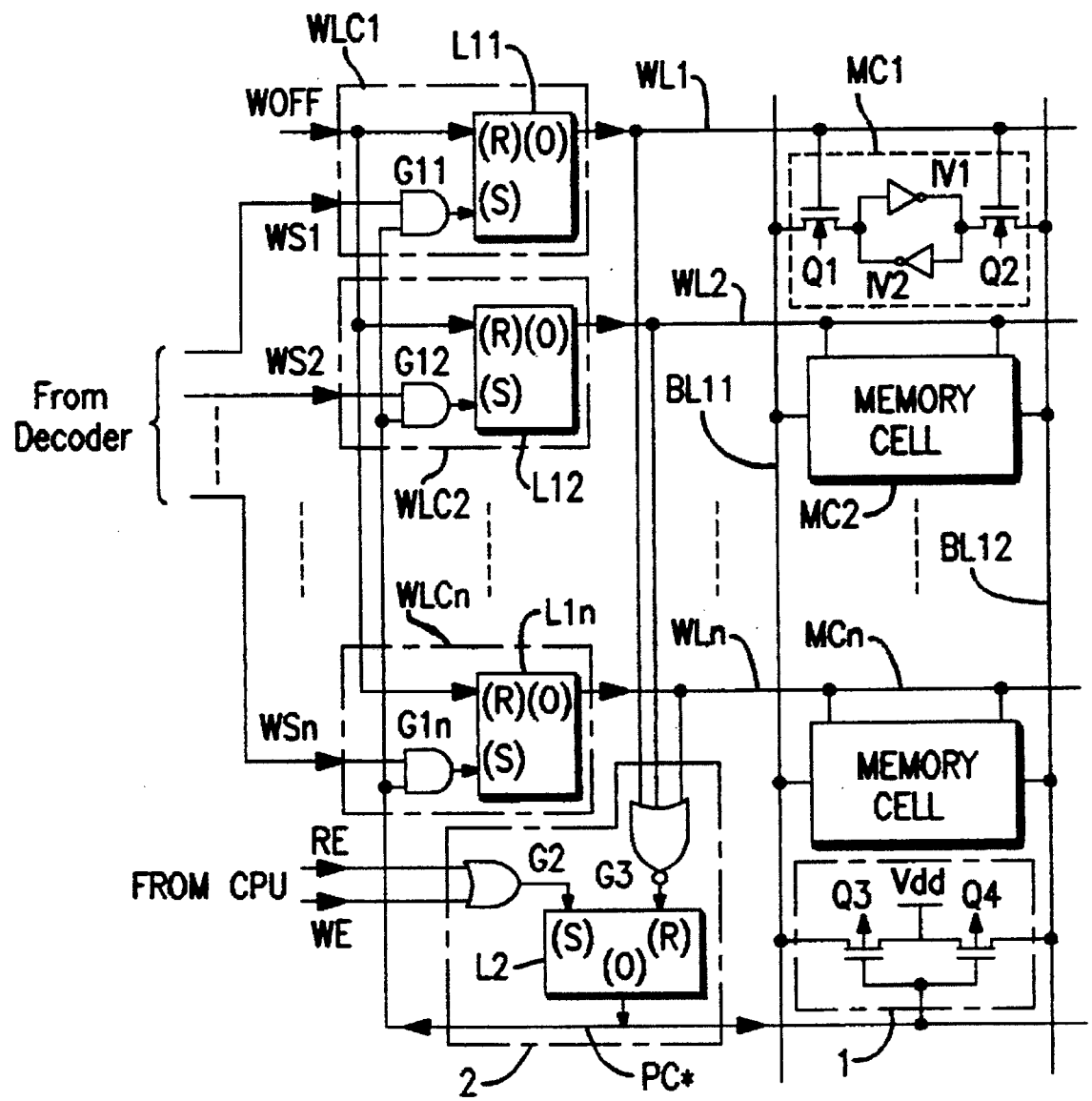
FIG. 1 shows a circuit diagram of a first embodiment of the present invention.

Referring to FIG. 1, a first embodiment has a plurality of word line level control circuit WLC1-WLCn connected to corresponding one of word lines, and a precharge signal generating circuit 2 connected to a plurality of precharging circuits 1.

To explain word line level control circuits WLC1-WLCn, the word line level control circuit WLC1 is used as an example in this section. The word line level control circuit WLC1 has a latch circuit L11 and a logic and gate G11. The logic gate G11 receives a precharge signal PC* from the precharge signal generating circuit 2 and a word line selecting signal WS1 from a decoder and outputs a set signal based on the precharge signal PC* and the word line selecting signal WS1. The word line level control circuit WLC1 has a reset terminal receiving a word off signal WOFF for resetting the latch circuit L11, a set terminal receiving the set signal from the logic gate G11 for setting the latch circuit L11, and an output terminal connected to the word line WL1. The word line level control circuit WLC1 activates the word line WL1 (high level) when the word line selecting signal WS1 and the precharging signal PC* are at a high level, and does not activate the word line WL1 (low level) when the word off signal is at a high level.

Figure 2:
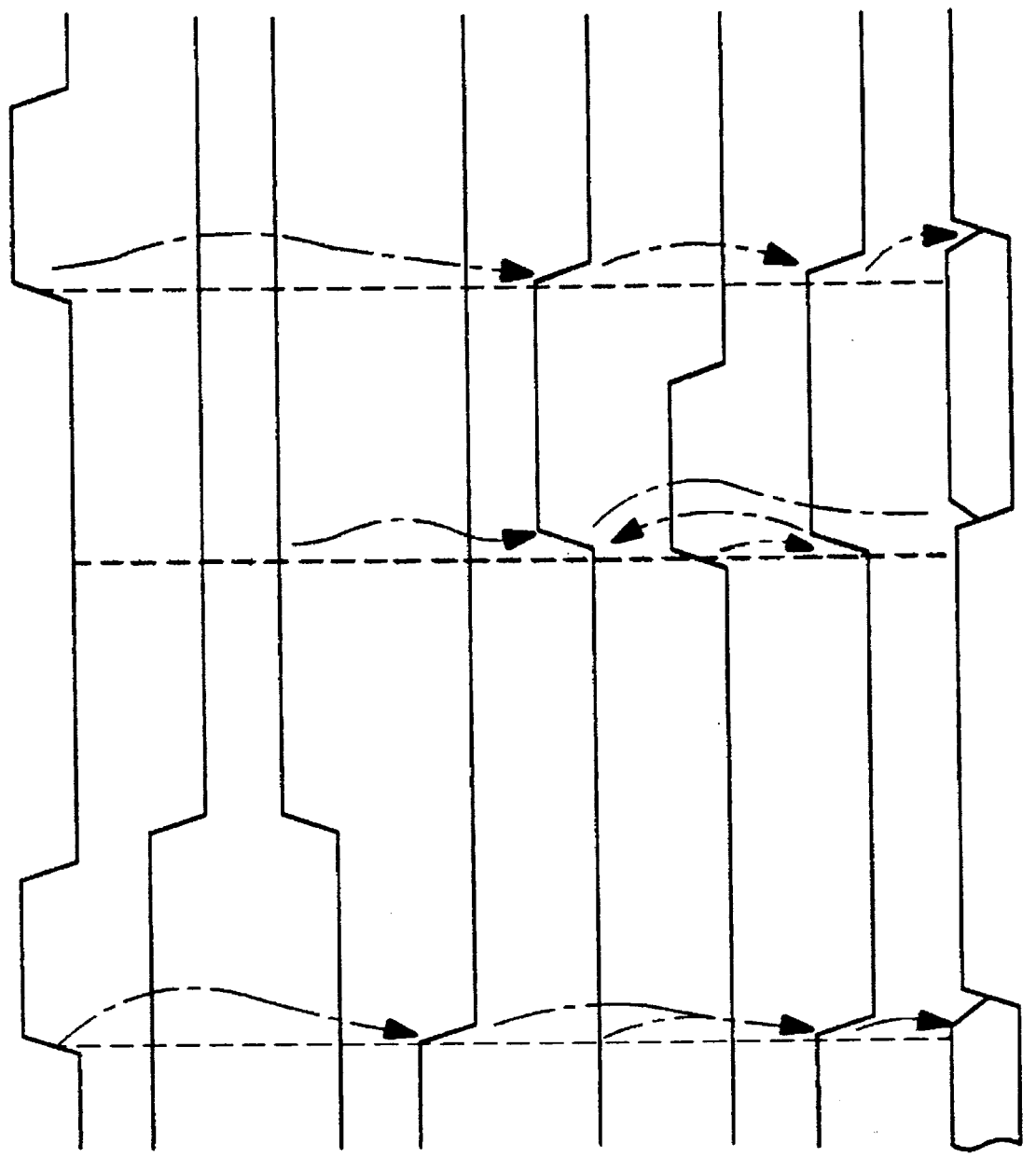
FIG. 2 shows a timing chart of the first embodiment.
Figure 4A:
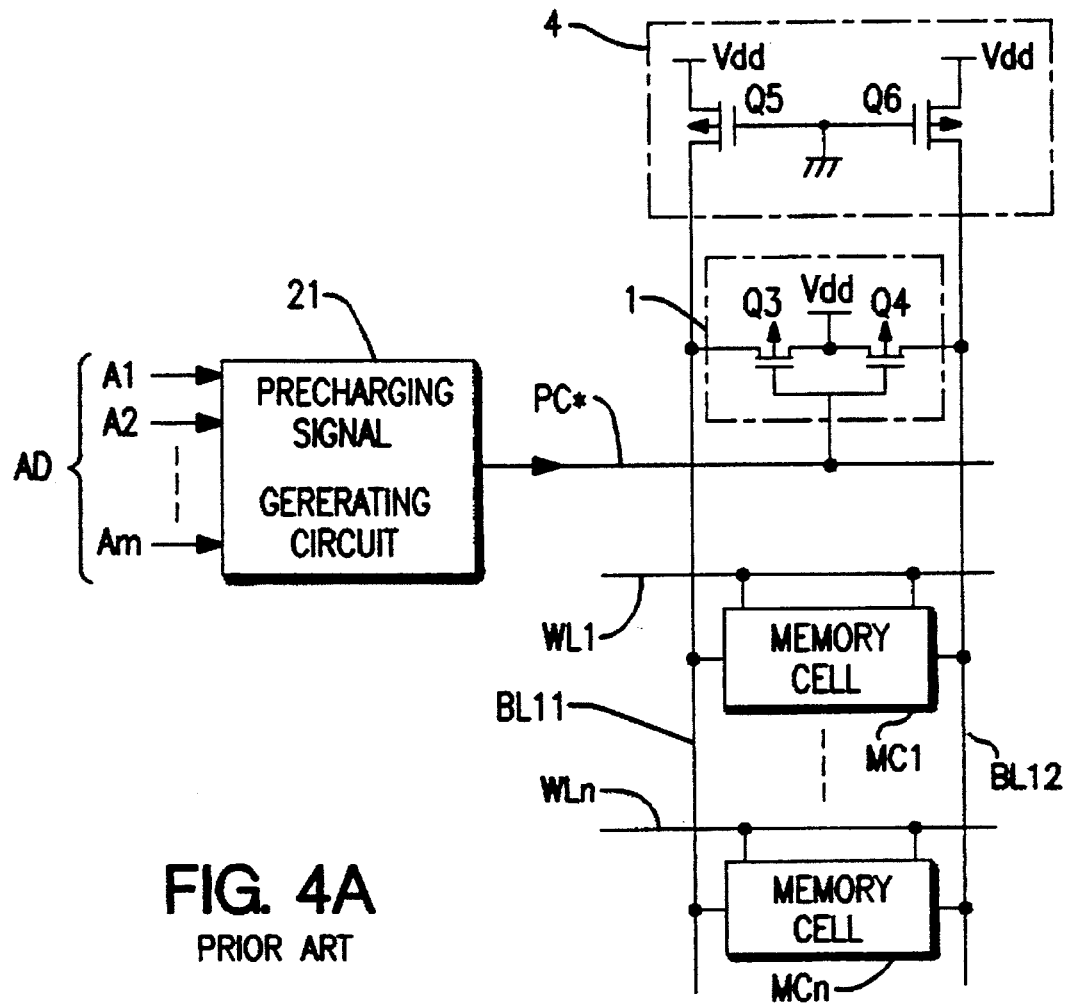
FIGS. 4(A) and (B) show a circuit diagram of a first example of the prior art.
Figure 4B:
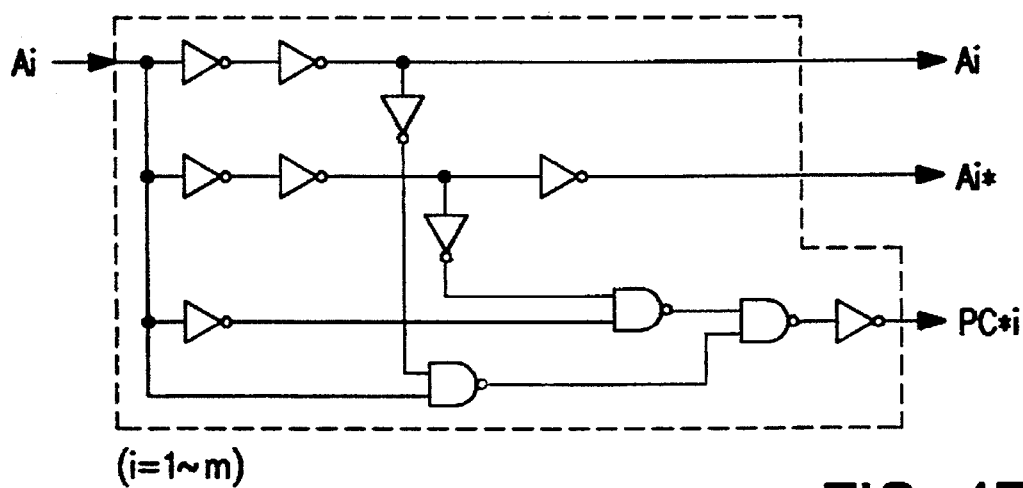

The precharge signal generating circuit 2 has an OR type logic gate G2, a NOR type logic gate G3 and a latch circuit L2. The logic gate G2 receives a read enable signal and a write enable signal from a Central Control Unit (CPU) and sets the latch circuit L2. The logic gate G3 connects to each of word lines WL1-WLn and resets the latch circuit L2 based on the levels of word lines WL1-WLn. Referring to FIG. 2, the operation of the first embodiment will be described.

The word off signal WOFF is a signal for forcibly bringing all the word lines WL1-WLn to the non-selection level (low level), and all the latch circuits L11-L1n are reset, as a result of response to the activation level being a high level of the word off signal WOFF, and its low level is held. Each of the output terminals of the latch circuits L11-L1n is connected to the corresponding word line (for example, WL1), and hence the word line (WL1) goes to the non-selection level which is a low level.

The logic gate G3 resets the latch circuit L2 at the low level by outputting a high level signal when all the word lines WL1-WLn are set to the non-selection level (low level), where the latch circuit L2 holds the low level. Since the output of the latch circuit L2 is used as the precharging signal PC*, the precharging signal PC* drives transistors Q3 and Q4 of the precharging circuit 1 while held at the activation (low) level, and precharges the bit lines BL11 and BL12 to the level of the potential Vdd of a power supply.

The release of the precharging takes place in response to the activation of the write signal WE and the read signal RE. Since the write signal WE and the read signal RE are output to the OR type logic gate G2, the output of the logic gate G2 goes to the high level when either one of the write signal WE and the read signal RE goes to the activation level (high level), and the latch circuit L2 is set to the high level. Accordingly, the precharging signal PC* is held at the non-activation level of high level, completing (releasing) the precharging.

In response to the high level of the precharging signal PC*, the word line selection signals WS1-WSn pass through the corresponding logic gates G1 and are input to the set terminals of the corresponding latch circuits L11-L1n. In this case, a word line selection signal (for example, WS2) at the selection level (high level) among the word line selection signals WS1-WSn sets and holds the corresponding latch circuits L11-L1n to the high level (selection level), and at the same time the word line (WL2) which receives the output signal of the latch circuit L11-L1n goes to the selection level.

Then, the memory cell MC1 connected to the word line WL2 at the selection level goes to the selective state to read out the data stored in this memory cell MC2 to the bit lines BL11 and BL12, and writes and stores the write data transmitted on the bit lines BL11 and BL12 into the memory cell MC2.

After that, as the word off signal WOFF goes again to the activation level, all the word lines WL1-WLn are brought to the non-selection level by the latch circuits L11-L1n and all the memory cells MC1-MCn are brought to the nonselective state as mentioned above. The latch circuit L2 is reset in response to the non-selection level of all the word lines WL1-WLn, its output, namely, the precharging signal PC*, goes to the activation level of low level, and the precharging for the bit lines BL11 and BL12 is started. Thereafter, the above mentioned operation are repeated.

In this first embodiment, at the start of the precharging of the bit lines BL11 and BL12, the level of the word lines WL1-WLn which control the selective state and the non-selective state of the memory cells MC1-MCn are detected directly by the logic gate G3, and the latch circuit L2 is reset and the precharging signal PC* is brought to the activation level when all of the word lines WL1-WLn are brought to non-selection level and the output of the logic gate G3 goes to the high level. Therefore, at the timing when the precharging signal PC* goes to the activation level, all the memory cells MC1-MCn are already surely in the non-selective state. Beside, at the time of transition to the release of the precharging, the transition of the precharging signal PC* to the high level of the deactivation level opens the gates of the logic gates G1 to supply the word line selection signals WS1-WSn to the set terminal S of the corresponding latch circuits L11-L1n, and the latch circuits L11-L1n corresponding to the word line selection signals at the selection level among these word line selection signals WS1-WSn, are set and the signals an the output ends of these latch circuits bring the corresponding word lines to the selection level. Therefore, at the timing when these word lines are set to the selection level, the precharging of the bit lines BL11 and BL12 is already surely released by the deactivation level of the precharging signal PC*, and hence, there occurs no destruction of the stored contents of the memory cells MC1-MCn due to the precharging operation of the bit lines BL11 and BL12.

Furthermore, the level of the precharging signal PC* is fixed by the latch circuit L2, a malfunction of the precharging circuit 1 does not occur when at least one of the word lines goes to high level based on noise or some other reason. Similarly, the levels of word lines WL1-WLn are fixed by latch circuits L11-L1n, a malfunction of selecting memory cells MC1-MCn does not occur when at least word line selective signals WS1-WSn goes to high level based on noise or some other reason.

Moreover, the period of time from the preparation of all the word lines to the non-selection level to the transition of the precharging signal PC* to the activation level, and the period of time from the transition of the precharging signal PC* to the deactivation level to the bringing of specified word line to the selection level are controlled by an absolute minimum number of circuit elements. Besides, the activation level of the precharging signal PC* is controlled by the direct detection of the non-selection level of the word lines, and the selection level of the word lines is controlled directly by the deactivation level of the precharging signal. Therefore, there is no need for setting a margin for the operation timings as was the case in the prior art, and hence, an improvement in the operating speed can be achieved.

Furthermore, the period of time from one activation level of the word off signal WOFF to the next activation level, that is, the period of one access cycle, is set by the period for access at the memory cell selection (access period) and the period for the precharging of the bit lines BL11 and BL12 (precharging period). Both of the access period and the precharging period are defined by a hard ware structure of memory.

Referring FIG. 3, a second embodiment will be described.

In a semiconductor memory device, there is normally provided a write buffer circuit for transmitting write data from outside to the bit lines BL11 and BL12. In this embodiment, the transmission of write data DI11 and DI12 to the bit lines BL11 and BL12 by a write buffer circuit 3 is arranged to take place only when the write signal WE is at the activation level (high level) and the precharging signal PC* is at the deactivation level. That is, the write buffer circuit is constituted of a logic gate G4 of AND type which inputs the write data WE and the precharging signal PC*, and buffer amplifiers BA1 and BA2 of tristate type which transmit the write data DI11 and DI12 to the bit lines BL11 and BL12 by raising the impedance between the output end of the logic gate G4 and the bit lines BL11 and BL12 when the output signal of the logic gate G4 is at the deactivation level.

With such a constitution, it is possible to prevent disturbance of the precharging level of the bit lines BL11 and BL12 due to the output signal of the buffer amplifiers BA1 and BA2, during the precharging period.

It will be understood that various other modifications will be apparent to and can be readily made by those skilled in the art without departing from the scope and spirit of the preset invention. Accordingly, it is not intend that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. A semiconductor device comprising:

a plurality of word lines;

a plurality of memory cells connected to corresponding word lines, each of said memory cells being connected to at least one bit line;

a precharge circuit for precharging said at least one bit line to a predetermined voltage corresponding to an active level of a precharge control signal;

a precharge control circuit for generating said precharge control signal, said precharge control signal being at said active level when all of said plurality of word lines are at a non-selective level and said precharge control signal being at an inactive level when an access control signal is input to said precharge control circuit; and a word line control circuit for controlling a level of a corresponding one of said plurality of word lines, said word line control circuit receiving a word line selective signal and said precharge control signal, said word line control circuit activating one of said plurality of word lines corresponding to said word line selective signal when said precharge control signal is said inactive level.

2. The semiconductor device as claimed in claim 1, wherein said at least one bit line comprises first and second bit lines, said memory cells connecting between said first and said second bit lines.

3. The semiconductor device as claimed in claim 2, wherein said precharging circuit includes:

a first transistor connected between said first bit line and a first node, a gate of said first transistor being connected to a second node for receiving said precharge control signal, and a second transistor connected between said second bit line and said first node, a gate of said second transistor being connected to said second node.

4. The semiconductor device as claimed in claim 1, wherein said precharging control circuit includes:

a gate circuit connected to all of said word lines for detecting when all of said plurality of word lines assume said non-selective level and for outputting a detecting signal, and a first latch circuit receiving said detecting signal to a reset terminal thereof and said access control signal to a set terminal thereof and outputting said precharging control signal at said active level when said detection signal is input to said reset terminal, said first latch circuit outputting said precharge control signal at said inactive level when said control signal is input to said set terminal.

5. The semiconductor device as claimed in claim 1 wherein, said word line control circuit includes:

a second latch circuit receiving said word line selective signal and said precharging control signal to a second set terminal thereof and a word line off signal to a second reset terminal thereof, said second latch circuit activating said word line when said precharge control signal assumes said inactive level and said word line selective signal assumes said selective level.

6. The semiconductor device as claimed in claim 5 wherein, said word line off signal has a cycle defined by an access period for accessing said memory cell and a precharging period for precharging said bit line to said predetermined voltage.

7. The semiconductor device as claimed in claim 5 wherein, said word line control circuit comprises an AND gate connected to said second set terminal, said AND gate receiving said word line selective signal and said precharge control signal to a first and second input terminal, respectively.

8. A semiconductor device comprising:

a plurality of word lines;

a plurality of memory cells connected to corresponding word lines, each of said memory cells being connected to at least one bit line;

a precharge circuit for precharging said at least one bit line to a predetermined voltage corresponding to an active level of a precharge control signal; and a precharge control circuit for generating said precharge control signal, said precharge control signal being at said active level when said all of said word lines indicate a non-selective level and being at an inactive level when an access control signal is input to said precharge control circuit.

9. A semiconductor device comprising:

a plurality of word lines;

a plurality of memory cells connected to corresponding word lines, and each of said memory cells connected to at least one bit line;

a precharge circuit for precharging said at least one bit line to a predetermined voltage corresponding to an active level of a precharge control signal;

a precharge control circuit for generating said precharge control signal, said precharge control signal being at said active level when said all of said word lines indicate a non-selective level and being at an inactive level when an access control signal is input to said precharge control circuit; and a writing buffer circuit for writing data to said memory cells when said precharge control signal goes to said inactive level and a write control signal goes to an active level and for inhibiting writing of data to said memory cells when one of said precharge control signal goes to said active level and said write control signal goes to an inactive level.

10. A semiconductor device as claimed in claim 9 wherein said write control signal is generated by a central control unit.

11. The semiconductor device as claimed in claim 9, wherein said at least one bit line comprises a first and second bit line, said memory cells being connected between said first and said second bit lines.

12. The semiconductor device as claimed in claim 11, wherein said precharging circuit includes:

a first transistor connected between said first bit line and a first node, a gate of said first transistor being connected to second node, and a second transistor connected between said second bit line and said first node, a gate of said second transistor being connected to said second node.

13. The semiconductor device as claimed in claim 9, wherein said precharge control circuit includes:

a gate circuit connected to all of said plurality of word lines for detecting when all of said word lines assume said non-selective level and for outputting a detecting signal, and a first latch circuit receiving said detecting signal to a reset terminal thereof and said control signal to a set terminal thereof and outputting said precharge control signal at an active level when said detection signal is input to said reset terminal and outputting said precharge control signal at an inactive level when said access control signal is input to said set terminal.

* * * * *